Figure 1:
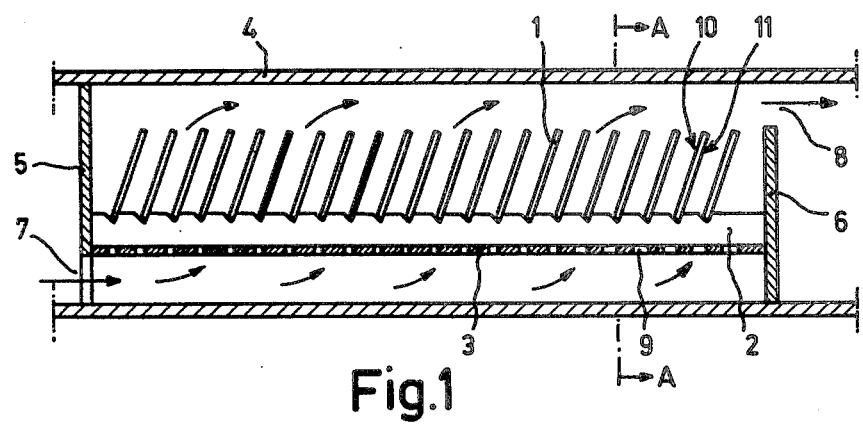

United States Patent [19]

Meuleman

[11] 4,018,183
[45] Apr. 19, 1977

[54] APPARATUS FOR TREATING A PLURALITY OF SEMICONDUCTOR SLICES TO A REACTING GAS CURRENT

[75] Inventor: Johannes Meuleman, Caen, France

[73] Assignee: U.S. Philips Corporation, New York, N.Y.

[22] Filed: Jan. 29, 1976

[21] Appl. No.: 653,498

Related U.S. Application Data

[63] Continuation of Ser. No. 523,439, Nov. 13, 1974, abandoned.

[30] Foreign Application Priority Data

Nov. 15, 1973 France .............................. 73.40669

[52] U.S. Cl. .............................................. 118/49
[51] Int. Cl.² ............................................ C23C 13/08
[58] Field of Search ............................ 118/48–49.5; 427/248, 252, 50–51, 69, 70, 78, 91, 109, 166, 167, 237; 148/174, 175, 179

[56] References Cited

UNITED STATES PATENTS 3,367,304  2/1968  Robbins ............................ 118/49.5

OTHER PUBLICATIONS

IBM Technical Disclosure Bulletin, "Emitter Diffusion System" Eshbach et al., vol. 13, No. 6, (Nov. 1970), p. 1459.

*Primary Examiner*—Morris Kaplan
*Attorney, Agent, or Firm*—Frank R. Trifari; Ronald L. Drumheller

[57] ABSTRACT

A method of uniformly exposing a plurality of semiconductor slices to a reacting gas flow, where the slices are arranged in a spaced stack within a tube and the gas is directed between said slices by a longitudinally positioned baffle wall having apertures the cross-section of which increase in the direction of gas flow.

2 Claims, 2 Drawing Figures

APPARATUS FOR TREATING A PLURALITY OF SEMICONDUCTOR SLICES TO A REACTING GAS CURRENT

This is a continuation, of application Ser. No. 523,439, filed Nov. 13, 1974, now abandoned.

The present invention relates to a method of treating a plurality of slices in a reacting gas current in which said slices are positioned, inside a reactor, in a row and parallel to each other with mutual interspaces according to the teeth of a comb, after which the reacting gas is supplied in the direction of the row in which the gas supply is divided substantially from one side of the row over the interspaces between subsequent slices, said interspaces being substantially equal. The invention furthermore relates to a method of manufacturing semiconductor devices comprising the step in which slices at least mainly consisting of monocrystalline material are treated in a reacting gas current, and semiconductor devices thus manufactured.

The expression "positioned according to the teeth of a comb" for the slices is to be understood to mean herein positioned with their main surfaces approximately perpendicularly to the direction of the row or according to more inclined positions. The above positioning of the slices for the methods mentioned above is described in U.S. Pat. No. 3,678,893. According to said U.S. Patent the slices are placed on a common longitudinal carrier in the form of an open rack. The semiconductor slices are given a somewhat inclined position and a gas carrying an impurity to be diffused into the semiconductor slices flows through the interspaces. To this end the rack with the row of slices is placed longitudinally inside a reaction tube. The reaction gas is entered at one side of the tube, and supplied to the semiconductor slices from a supply current running below the rack with the row of slices. From this longitudinal gas flow the gas is divided over the interspaces.

It is found, however, that in treating semiconductor slices with such a reacting gas in a manner as described above, the slices may show differences after the treatment. It is further found that these differences are more notable as the differences in serial numbers of two slices being compared with each other are larger. When, instead of diffusing an impurity in semiconductor slices according to known art the gas treatment as described above is used for epitaxially depositing monocrystalline semiconductor material onto a monocrystalline substrate, these differences are even more pronounced, for instance, with regard to the thickness of the deposited epitaxial layers. It is an object of the present invention to provide a method of treating slices in a reacting gas of the type as described in the preamble in which such differences are decreased and/or become negligible. The cause of the differences found in known art processes may be due to the fact that the supply current, in its course along the row of slices, will decrease due to the branching-off current through the interspaces so that gas pressure to the slices at the beginning of the row, when counting from the side of arrival of the gas supply, will be larger than the gas pressure to the slices further on in the row. It is therefore a further object of the present invention to more equalize the gas pressure to the different slices. According to a first aspect of the invention a plurality of slices are positioned inside a reactor, in a row and parallel to each other with mutual interspaces according to the teeth of a comb, after which reacting gas is supplied in the direction of the row. The gas supply is divided on one side of the row over the interspaces between subsequent slices, said interspaces being substantially equal and the supplied gas is divided over the interspaces with the aid of an apertured wall positioned at said one side of the row of slices. The apertures of said wall serve for passage of the supplied gas, the cross-sectional area of said apertures per unit of length increasing in the direction of the gas supply current.

The direction of said row may be substantially horizontal and the apertured wall may then be provided underneath the slices. Furthermore the said cross-sectional area per unit of length of the apertures in the said wall may increase substantially lineacly in the direction of the gas supply current.

The said method may particularly be important in the case where the slices are substantially congruent. In that case the slices may preferably be positioned in the row in substantially similar orientations. In the case where the slices are given a substantially rectangular form said slices may be positioned with a similarly oriented side of the rectangle positioned at the side of the row nearest to the apertured wall such that said similarly oriented sides are positioned in a common plane substantially parallel to the apertured wall. In that case preferably the apertures are given the form of mutually parallel slits having lengths substantially equal to the length of the said rectangle side of each of the slices. In that case a more uniform distribution of the gas current inside each interspace is improved.

The method according to the first aspect of the invention may be applicable in general whenever a plurality of slices should be treated in a reacting gas current. The method is particularly important in semiconductor technics. Therefore, according to a second aspect of the invention a method of manufacturing semiconductor devices comprising the step in which slices at least mainly consisting of monocrystalline material are treated in a reacting gas current, is characterized in that said treatment is carried out according to the method according to the first aspect of the invention. In that case the slices are preferably oriented substantially equally.

According to a first embodiment said slices may comprise exposed semiconductor material at a major surface and a doping element present in said reacting gas may be diffused in said exposed semiconductor material during said treatment.

According to another preferred embodiment at a major surface of each slice monocrystalline material is exposed at at least part of said surface and semiconductor material is deposited from the reacting gas epitaxially on said monocrystalline material.

The invention furthermore relates to a semiconductor device manufactured by using a method according to the second aspect of the invention.

The invention will be further described with reference to the accompanying drawing showing part of an apparatus for treating slices with a reacting gas in accordance with the invention.

Figure 2:
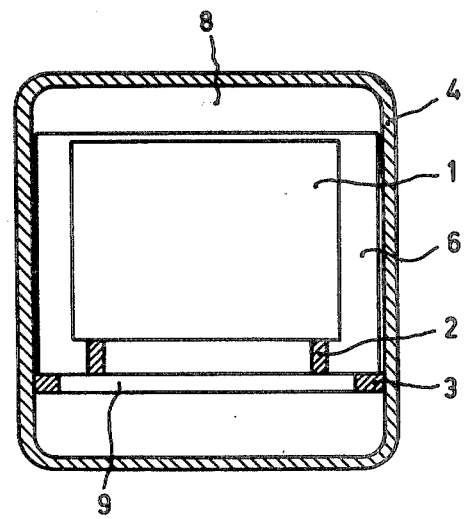

FIG. 1 is a schematic longitudinal cross-section of said part of the apparatus and FIG. 2 is a schematic cross-sectional view of said apparatus according to the line A—A of FIG. 1.

Slices 1 to be treated with a reacting gas are placed inside a reactor tube 4 consisting of a suitable refractory material. The Figures show schematically the treatment of slices of substantially rectangular form. As shown in FIG. 2 the reactor tube 4 may also have a rectangular form. In this respect it is to be noted that the term "tube" and "tubular" are not limited to circular cross-sections. The reactor tube 4 is positioned substantially horizontally. It encloses two vertical partitions 5 and 6, positioned at opposite ends of the actual reactor space. The vertical partition 5 is suspended from the upper wall of the reactor tube and extends between the two side walls of said reactor tube. It leaves a passage 7 between its lower side and the bottom of the tubular reactor 4, serving as a gas inlet. The partition 6 is positioned on the bottom of the reactor tube 4 and between the side walls of the reactor tube. It leaves a passage 8 between the partition 6 and the upper wall of the tubular reactor 4, which passage serves as a gas exit. An apertured wall 3 is positioned substantially horizontally in the reactor tube 4. Laterally it extends from one side wall of the tubular reactor 4 to the other side wall of said reactor tube. Longitudinally it extends from the partition 5 to the partition 6. The apertured wall 3 is provided with apertures 9 in the form of slits with their lengths perpendicularly to the longitudinal direction of the tubular reactor. A support 2 for the slices to be treated consists of two beams positioned parallel to each other in the longitudinal direction of the tubular reactor. The upper sides of the beams are provided with recesses for positioning the slices in an upright position. The distances between subsequent recesses are equal everywhere for both beams. In the present case the centre distances between subsequent recesses in the beams forming the carrier 2 are equal to the centre distances between subsequent apertures 9 in the apertured wall 3. The slices 1 of substantially rectangular form are positioned in the recesses on the carrier 2 in a similar somewhat inclined position substantially parallel to each other. In case they may comprise or even mainly consist of single crystal material, for instance semiconductor single crystal material they are preferably oriented equally. If it is the main object to treat one of the major surfaces, the slices are put in the inclined positions such that the surfaces 11 face more downwards than the opposite surface 10 as is shown in FIG. 1. In this way contamination of surface 11 by particles falling down by gravity is prevented. Furthermore the inclinations of the slices 1 are such, that the lower portion of each slice is somewhat nearer the partition 5 than the upper portion.

For uniformly treating the slices 1 with a reacting gas the reactor tube 4 may be placed in a tubular furnace such that the row of slices is heated at a substantially uniform temperature. The reacting gas flows in the actual reactor space between these partitions 5 and 6 from the inlet 7 towards the outlet 8. The gas supply for the slices 10 flows from the inlet 7 in the direction of the partition 6 in the space portion underneath the apertured wall 3. From this gas supply it is divided over the apertures 9 and passes the slices 1 through the different interspaces between subsequent slices from the apertured wall 3 towards the space portion between the slices and the upper wall of the reactor tube 4. In this way the slices 1 are subjected to the reacting gas. The exhaust gases flow horizontally in the upper space portion towards the gas outlet 8.

In the present case, in which the gas supply current is running in the lower reactor space portion underneath the apertured wall 3 from the inlet 7 towards the partition 6, the gas supply current decreases every time a portion of the gas current is branching off through the subsequent apertures 9. The gas flow per unit of area of each aperture 9 depends on the gas flow inside the lower reactor space portion at the location of said aperture. As the latter gas flow will diminish gradually in the direction from the inlet 7 towards partition 6, the gas flow per unit of area through the apertures 9 will also diminish in said direction. In case the apertures 9 would have the same cross-sectional area the gas current along the slices would decrease in the direction from partition 5 to partition 6. This means that the amount of reactive components, such as doping materials or components for material to be deposited, striking per unit of time over each slice would also decrease in said direction. The treated slices might show differences in said case.

In accordance with the principle of the present invention the cross-sections of the slits 9 in the wall 3 are given widths increasing from the inlet 7 towards the partition 6. In this way it is possible to divide the gas supply current over the slits 9 such that an equal gas flow passes through each interspace between adjacent slices.

The process carried out in the above reactor described with reference to the accompanying drawing, may consist in diffusing a doping impurity in a number of slices, mainly consisting of semiconductor material, at a major surface of which the semiconductor material is exposed, for instance only locally by using a patterned diffusion mask, as is well known in the art.

It was furthermore found that good results may be also obtained with the reactor as described in the case of epitaxially depositing semiconductor material onto a single crystal substrate, for instance also consisting of semiconductor material. According to normal prior art, in epitaxial deposition processes, the slices are positioned with the major surface opposite the surface onto which the deposition should take place, onto a flat carrier surface. For example, with the method according to the present invention good results have been obtained in depositing epitaxial layers consisting of gallium arsenide or gallium arsenide-phosphide of uniform thickness onto a plurality of slices consisting of monocrystalline gallium arsenide. The widths of the slits 9 may easily be chosen by those skilled in the art by calculation. Also the cross-section of the space portion underneath the apertured wall 9 should be taken into account and possibly other parameters such that the total current resistance for a flow through each interspace from inlet to outlet should be substantially the same.

In practice linearly increasing widths of the slits may constitute a suitable approximation on the one hand for a simplified construction of the apertured wall and on the other hand for obtaining acceptable results in practice.

Although only one reactor has been described schematically with the aid of the accompanying drawing and a few applications have been mentioned explicitly, it is clear to those skilled in the art that a wide variety of applications, not only limited to semiconductor technology, and various forms of the wall with apertures are possible within the scope of the present invention.

I claim:

1. Apparatus for treating a plurality of semiconductor slices to a reacting gas current, comprising:
   a reactor tube having a longitudinal axis;

means for supporting a plurality of semiconductor slices in a parallel spaced row along said longitudinal axis, said slices being equally spaced to create identical transversely oriented interspaces between slices;

an apertured wall along one side of said row, parallel to said axis and having apertures in the form of slits oriented one to each interspace and parallel thereto;

partitions cooperating with said apertured wall to confine and direct gas flow to one side of said apertured wall, through said slits and the spacing between said slices and out of the reactor tube, the cross-sectional area of the apertures in said apertured wall increasing in the direction of overall gas flow, so that equal flow occurs in each interspace.

2. Apparatus as defined in claim 1, wherein the cross-sectional area of the apertures in said apertured wall increases substantially linearly in the direction of overall gas flow.

* * * * *